US009443747B2

(12) United States Patent
Lee

(10) Patent No.: US 9,443,747 B2
(45) Date of Patent: Sep. 13, 2016

(54) APPARATUS FOR TRANSFERRING AND MANIPULATING SEMICONDUCTOR COMPONENTS

(71) Applicant: EXIS TECH SDN BHD, Seremban (MY)

(72) Inventor: Heng Lee Lee, Seremban (MY)

(73) Assignee: EXIS TECH SDN BHD (MY)

( * ) Notice: Subject to any disclaimer, the term of this patent is extended or adjusted under 35 U.S.C. 154(b) by 315 days.

(21) Appl. No.: 14/164,361

(22) Filed: Jan. 27, 2014

(65) Prior Publication Data
US 2014/0212246 A1    Jul. 31, 2014

(30) Foreign Application Priority Data

Jan. 25, 2013 (MY) .......................... PI 2013700157

(51) Int. Cl.
| G01R 31/00 | (2006.01) |
| H01L 21/67 | (2006.01) |
| G01R 31/26 | (2014.01) |
| H05K 13/04 | (2006.01) |

(52) U.S. Cl.
CPC ......... *H01L 21/67132* (2013.01); *G01R 31/26* (2013.01); *H05K 13/0404* (2013.01)

(58) Field of Classification Search
CPC ............. G01N 1/312; G01N 35/0099; G01N 35/025; G01N 25/043; H01L 21/67092; H01L 21/67132; G01B 2210/56; H05K 13/0404; G11B 25/043; G01R 1/048; G01R 31/01; G01R 31/26; G01R 31/2893; G01R 31/28

See application file for complete search history.

(56) References Cited

U.S. PATENT DOCUMENTS

| 3,702,923 | A | * | 11/1972 | Wiesler | ................... B07C 5/344 |
| | | | | | 250/566 |
| 6,435,582 | B1 | * | 8/2002 | DaSilva | ............... B25J 15/0052 |
| | | | | | 294/87.1 |
| 9,134,342 | B2 | * | 9/2015 | Lee | ........................ G01R 1/0408 |
| 2003/0044267 | A1 | * | 3/2003 | Pfeiffer | ................ G11B 17/038 |
| | | | | | 414/788.1 |
| 2008/0101894 | A1 | * | 5/2008 | Cheng | ............... H01L 21/67092 |
| | | | | | 414/222.13 |
| 2014/0178169 | A1 | * | 6/2014 | Hebert | ...................... B01L 9/52 |
| | | | | | 414/752.1 |

* cited by examiner

*Primary Examiner* — Vinh Nguyen
(74) *Attorney, Agent, or Firm* — Bacon & Thomas, PLLC

(57) ABSTRACT

An apparatus for picking and placing or for picking and transferring or for picking, placing and pressing semiconductor components (10) is disclosed. The apparatus (10) comprises a motor for generating power to rotate a turret (6) which holds a plurality of pick up heads (7), a plurality of pressers (8), wherein each of said pressers (8) is a voice coil assembly (3) which consist of voice coil actuator assemblies (31), at least one stationary frame (1, 2) to secure said voice coil assemblies (3) and a controller means to control the direction and magnitude of displacement of said voice coil actuator assemblies (31). When current flows into voice coil in said voice coil actuator assembly (31), electromagnetic force is generated in vertical direction, forcing said actuators to press said pick up heads (7) located directly below said actuators at a particular moment, which in turn reaches to and press on wafers or semiconductor components located below said pick up heads. The pressing force, speed and direction of each actuator can be controlled individually. Furthermore, this invention includes safety measures wherein a real time actuator position feedback system is used to confirm the displacement of said actuators and an urging device (35) is used to return the actuators back to their original position in the event of power outage.

22 Claims, 6 Drawing Sheets

APPARATUS FOR TRANSFERRING AND MANIPULATING SEMICONDUCTOR COMPONENTS

FIELD OF INVENTION

The present invention relates to an apparatus for picking and placing or for picking and transferring or for picking, placing and pressing semiconductor components to and from a work station. An example of an application of the apparatus of the present invention is the use of the apparatus in a work station for testing. Such tests include identifying physical defects and determining the electrical integrity of the internal circuit. In particular the pickup heads are operated by individual voice coil actuator with position feedback.

BACKGROUND OF THE INVENTION

Malaysian Patent Application No. PI 2012002321 filed by the Applicant discloses an apparatus and method for testing of semiconductor components using turret machine and more particularly the apparatus involves the use of a linear motor with mechanical pushers to control the vertical motion of the pickup heads.

The apparatus of this prior art has a continuous delivery system in which the base machine consists of a turret system with 32 pickup heads that is capable of rotating in a circular motion in order to perform different tests in one cycle. The advantage of the apparatus of this prior art invention is that the machine is capable of picking up and processes two types of semiconductor components simultaneously or alternatively doubles the amount of the same semiconductor components being processed.

One end of each of said mechanical pushers is attached to a rim on said base machine. The vertical movement of said rim is powered by a linear motor. As all said mechanical pushers are attached to said rim, all said mechanical pushers move in unison.

Taking the use of the apparatus of this prior art for testing of semiconductor components as an example, during operation, the pick up head, which picked up and carry the semiconductor test component, is pressed against a printed circuit board at a test station with a downward force of a predetermined magnitude by a vertically descending mechanical pusher. A certain amount of force is needed so that the test semiconductor component gets a good contact with the printed circuit board. However, the semiconductor test component or the printed circuit board may break if an excessive amount of force is applied. The force that is exerted on the printed circuit board is dependent on the linear motor and a spring in the mechanical pusher. This threshold force differs for different semiconductor components so that when different types of semiconductor components are tested, several parameters need to be varied and recalibrated including the range of displacement of said mechanical pushers. This results in unproductive change over time.

On top of that, there is an upper limit on the force that can be applied. The apparatus of this prior art needs to be enhanced with additional feature should a greater amount of force is needed. Furthermore, as all the pushers are being attached to a rim, all the pushers move in unison in a vertical direction and the force exerted on any of the pick up head is the same and limited to only one force magnitude at one time. This is undesirable when different level of force is required to be applied on the components for carrying out different tests simultaneously in one test cycle.

Another drawback to the tester using mechanical pushers is that there is a limitation on the speed of the pushers. At higher speed, the linear motor and the mechanical pushers require more load. However, this will result in an increase in unwanted heat and noise, which is not favourable.

As the thickness of wafers and semiconductor components are getting ever thinner, the preciseness of the reach of the pick up heads or the pressing force of pick up heads on the target objects can greatly influence the yield and through put of a production process. The use of linear motor to control the motion of the pushers, and thus the pick up heads, does not have the preciseness, speed and flexibility required in handling simultaneously multi semiconductor components or wafers in a production process. Similarly, in situation where more delicate pressure and preciseness in reach to the target objects are required, such as very pressure sensitive ultra thin target objects, a linear motor control system is no longer adequate.

In view of these and other shortcomings of the existing art, it would be useful and advantageous to provide an apparatus that can controls the movement of said pickup heads independently of each other, yet, able to apply different force magnitudes on each pick up heads respectively.

It is another objective of the present invention to provide an apparatus that requires simple calibration which takes minimal time, when different force is needed to be applied on the test components.

It is yet another objective of the present invention to provide an apparatus which is able to support higher limit on the pressing force magnitude on the test components.

It is yet another objective of the present invention to provide an apparatus which can operate at faster speed, which allow higher productivity due to reduced change over time and higher throughput.

It is yet a further objective of the present invention to provide an apparatus adapted to pick, place and/or press on a very thin, delicate wafer or semiconductor components with great preciseness so as to reduce breakage considerably.

SUMMARY OF THE INVENTION

The present invention relates to an apparatus for picking and placing or for picking and transferring or for picking, placing and pressing semiconductor components to and from a work station or process line. The apparatus for picking and placing or for picking and transferring or picking, placing and pressing semiconductor components of the present invention comprises a rotatable turret holding a plurality of pressers, wherein each of said pressers is a voice coil assembly. The pressers replace the mechanical pushers of the prior art to provide the required pressing force at a work station. At least one stationary horizontal frame located vertically above said turret is provided, to support the mounting of said voice coil assemblies.

In the preferred embodiment, each voice coil actuator assembly is sandwiched between a pair of magnet plates, in which the magnets are mounted one each on either side of a skeletal frame. The apparatus of the present invention further includes a controller means to store parameters to control separately the movement of each of the voice coil actuator assemblies. Each voice coil assembly may include a positioning encoder to provide feedback to said controller that controls the direction and magnitude of displacement of the voice coil actuator assemblies. The rotation movement of the turret is powered by a motor with a rotor shaft and housing. A vertical support frame is mounted right on top of said housing and said vertical support frame supports said horizontal stationary frame.

For ease of illustration, the apparatus for use with a test station is used as an example. The apparatus first will pick up a semiconductor test component from a first station with one of the pick up head. This first station is a gimbal that receives semiconductor components from a feeder, which maybe a bowl, tube, tray, or rail feeder or wafer loader or other input station. A vision inspection system will check if the orientation of an incoming semiconductor component is correct, otherwise the gimbal orientates the received semiconductor component to the right orientation before said semiconductor component is being picked up by a pick up head of the apparatus. The pick up heads are pneumatically controlled to pick up or release the semiconductor components. The turret which holds all pick up heads will then rotate again, and will reach a second station which may be a test station. At the test station, the apparatus will place and press the test component on a printed circuit board or means for testing at the test station. A semiconductor component may be subject to different parametric or functional tests at several different stations to complete all the predetermined tests. Thus each pick up head with the test component that it has picked up will need to move progressively from one station to another.

At the last station, the test components that passed all the tests will be released by the respective pick up heads on a packaging station while the test components that fail one or more test will be released at another station. These stations, including the gimbal, the test stations, the packaging station, the feeder and the vision inspection system or associated auxiliary equipment are outside the scope of this invention.

The movement in axial direction of the pick up heads is controlled by the voice coil actuator assemblies. In each rotation, there is one pick up head located below each said actuator assembly, said actuator assembly will then actuates in axial direction when electrically excited. When current flows in the voice coil actuator assembly, an electromagnetic force is generated, causing the voice coil actuator to slide downwards, and thus further pressing the pick up head in the same axial direction. The direction of the actuation is also controlled by the direction of the current flowing into said voice coil. In the event of a power outage, an urging device will push the actuator back to its original idle position. This is to avoid the voice coil actuator continuing pressing down and causing damage to the circuit board component.

The number of pick up heads can be varied. In one embodiment, 32 pick up heads rotating in a circular motion are provided. A pick up head will pick up one test components during each rotation. The apparatus can be designed such that two test components are picked up during one rotation by diametrically opposite pick up heads. In such configuration, two sets of test stations and feeders are set up. In other words, the maximum distance traveled by each test component is half cycle and the throughput is doubled. Furthermore, using the same methodology, this apparatus could be used to test two different semiconductor components at the same time, one type at each half-cycle.

DETAILED DESCRIPTION OF THE INVENTION

A detailed description of preferred embodiments of the invention is disclosed herein. It should be understood, however, the disclosed preferred embodiments are merely exemplary of the invention, which may be embodied in various forms. Therefore, the details disclosed herein are not to be interpreted as limiting, but merely as the basis for the claims and for teaching one skilled in the art on the invention.

Figures 1, 1A:
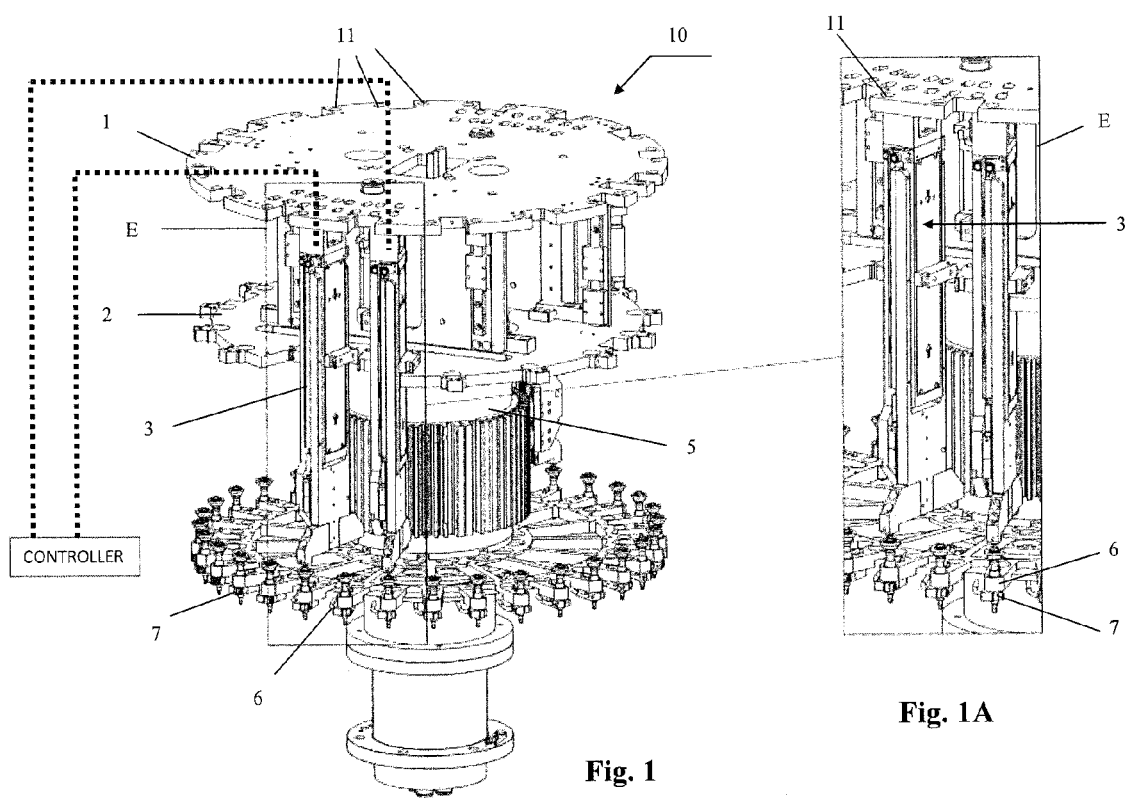
FIG. 1 is a perspective view of the apparatus of the present invention with part of the second stationary horizontal plate removed.
FIG. 1a is an enlarged view of FIG. 1 at the box marked E.

Referring to FIG. 1, in a preferred embodiment, the apparatus for picking and placing or for picking and transferring or for picking, placing and pressing semiconductor component (10) of the present invention comprises a motor in a housing (5) with a rotor shaft extending there out, a turret (6) with a plurality of spaced apart pick up heads (7) mounted thereon, a first stationary horizontal frame (1) fixedly mounted onto a vertical support frame, a plurality of spaced apart pressers (8), wherein each of said pressers (8) is a voice coil assembly (3) comprising an actuator assembly (31, FIG. 2) slidably movable in a direction parallel to the axis of said rotor shaft and a controller means electrically connected to each of said actuator assemblies (31) to control independently the direction and magnitude of displacement of each of said actuator assemblies (31).

Said motor has its rotor shaft oriented vertical downward with said turret (6) mounted on the free end of said rotor shaft, enabling the rotation of said turret (6) to be powered by said motor. The vertical axis of said motor and said turret (6) is coaxial to enable the turret (6) to be rotated horizontally about the axis of said rotor shaft. One end of said vertical support frame is adaptably secured to the housing (5) of said motor with said first stationary horizontal frame (1) secured on the other end. In such configuration said first stationary horizontal frame (1) is located vertically above said turret (6).

Preferably, said first stationary horizontal frame (1) is a disc like plate with spaced apart holes (11) for receiving fastening means to securely and detachably fasten each of said plurality of spaced apart pressers (8) circumferentially onto said first stationary horizontal frame (1).

Referring now to FIGS. 2 to 6, each of said voice coil assemblies (3) comprises a skeletal frame (32) securely and detachably mounted on to said first stationary horizontal frame (1), a pair of voice coil magnet plates (33), one each mounted on either side of said skeletal frame (32), an actuator assembly (31) slidably movable in a direction parallel to the axis of said rotor shaft to provide a pressing force onto said pick up head (7) located below said actuator assembly (31) at a particular moment of the rotation of the turret (6). The skeletal frame (32) is a hollow structure integrally formed by a front plate (323) with an oblong opening (323a) and a spaced apart rear plate (324) with an oblong opening (324a), with the front and rear plates (323, 324) joined at the top by a top member (325) and at the bottom by a bottom member (326). In addition to the oblong openings (323a, 324a) at the front and rear, the front plate (323), the rear plate (324), the top member (325) and the bottom member (326) also define an oblong opening (328) on each of the sides of the skeletal frame (32). The front plate (323) has an extension plate (322) at the bottom. Hence the skeletal frame (32) is hollow at the centre with oblong openings (323a, 324a, 328) at the front, rear and sides and an extension plate (322) extending down its front plate (323). The top member (325) is adapted to detachably secure the respective voice coil assembly (3) onto said first stationary horizontal frame (1) by fastening means. The front and rear plates (323, 324) are provided with a plurality of mounting bars (327) with holes for fasteners to enable the voice coil magnet plates (33) to be fastened onto the skeletal frame (32) to close up the oblong holes (323a, 324a) on the front and rear plates (323, 324). Preferably, the combined thickness of a mounting bar (327) and that of a voice coil magnet plate (33) is substantially the same as the thickness of the front or rear plate (323 or 324) such that the voice coil magnet plates (33) are flushed with the external surfaces of the front and rear plate (323, 324) respectively. Preferably, the skeletal frame (32) is made of metal. More preferably, the skeletal frame (32) is a non magnetic skeletal frame (32).

Figure 6:
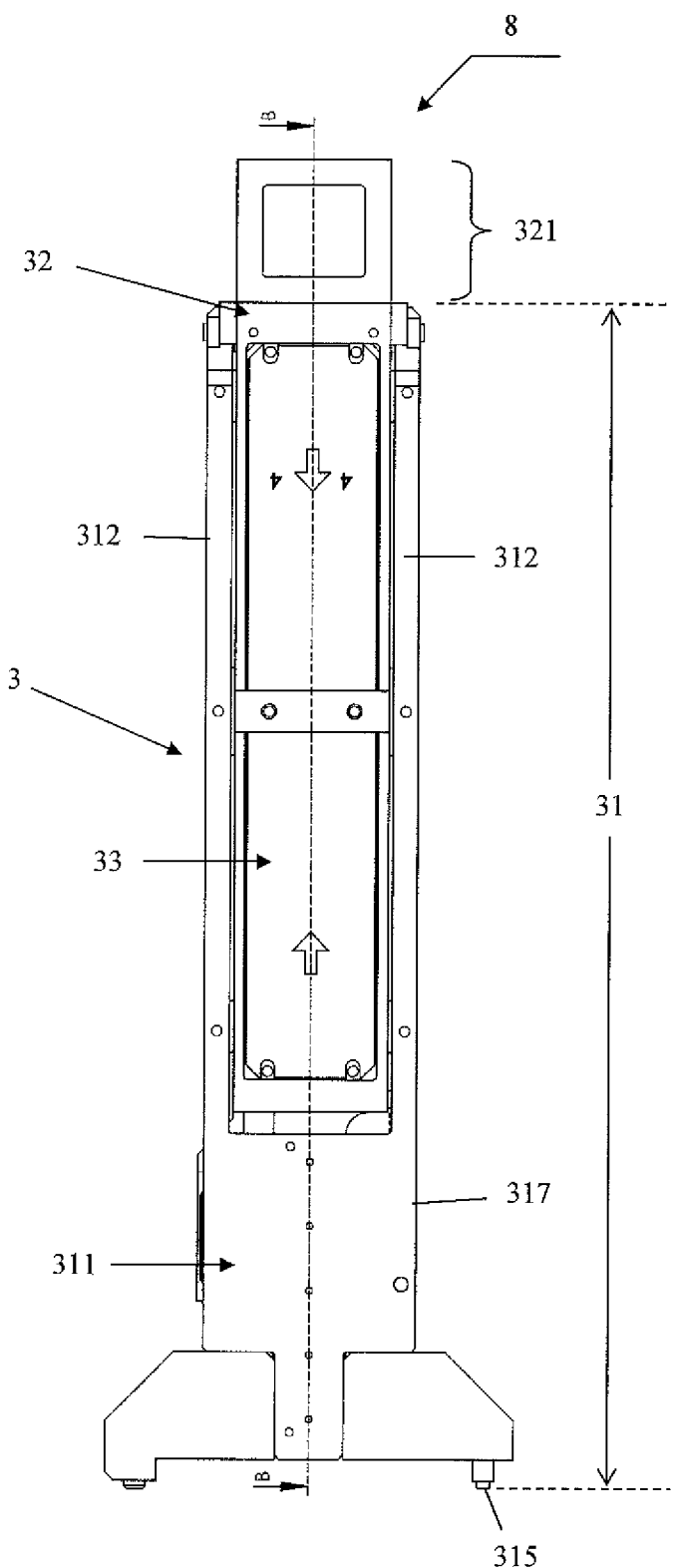
FIG. 6 shows the front view of the voice coil assembly with the actuator assembly partially extended downward.

Each said actuator assembly (31) comprises an actuator frame (311), a voice coil frame (313) with at least one voice coil located therein, a pair of slider plates (314) and a pusher (315). The actuator frame (311) has a plate like body (317) extending upwards into two arms (312). The arms (312) define a U-shaped opening which envelops the bottom and sides of the rear plate (324) of said skeletal frame (32) when said actuator frame (311) is in its non extended position. That is the width between the side inner faces of said two arms (312) is marginally but sufficiently greater than the width between the side outer faces of the rear plate (324) of the skeletal frame (32) to enable the U-shaped opening to envelop the bottom and sides of the rear plate (324) as shown in FIG. 6 except that in FIG. 6 the bottom of the U-shaped opening is not shown touching the bottom of the bottom member (326) of the skeletal frame (32) as this is a drawing showing the actuator assembly (31) in an extended out position. The pusher (315) is located at the bottom of said body (317) of said actuator frame (311).

The voice coil frame (313) has two side members (313a) joined together by a top member (313b) and a bottom member (313c) to define an oblong opening (313e), said oblong opening (313e) is sufficiently sized to house at least one voice coil. The voice coil is electrically connected to the controller means. The voice coil frame (313) is sandwiched in between said pair of voice coil magnet plates (33) and positioned inside the hollow center of said skeletal frame (32). The widths between the side inner and outer faces of the side members (313a) is substantially the same as the corresponding widths between the side inner and outer faces of the arms (312) of the actuator frame (311). In assembly, the voice coil frame (313) is inserted into place through either of the oblong opening (328) on the sides of the skeletal frame (32). When the voice coil frame (313) is inserted in place, its external width is substantially the same as the external width between the arms (312) of the actuator frame (311) and one surface of the two side members (313a) of the voice coil frame (313) is in contact with the arm (312) of the actuator frame (311) and the other surface is exposed. A slider (314) plate is then placed on each exposed surfaces of the side members (313a) of the voice coil frame (313), thereby sandwiching the side members (313a) of the voice coil frame (313) between the arms (312) of the actuator frame (311) and the sliders (314). A plurality of fasteners fastens the sliders (314) and the respective side members (313a) of said voice coil frame (313) to the arms (312) of said actuator frame (311) together via holes (318, 313d, 314a FIG. 5) on the actuator frame (311), the voice coil frame (313) and the sliders (314) respectively to complete a basic voice coil assembly (3). In this way, the actuator frame (311), the voice coil frame (313) and the sliders (314) are fasten together to form the actuator assembly (31). The voice coil frame (313) is moveable vertically within the hollow space of the skeletal frame (32).

Figure 2:
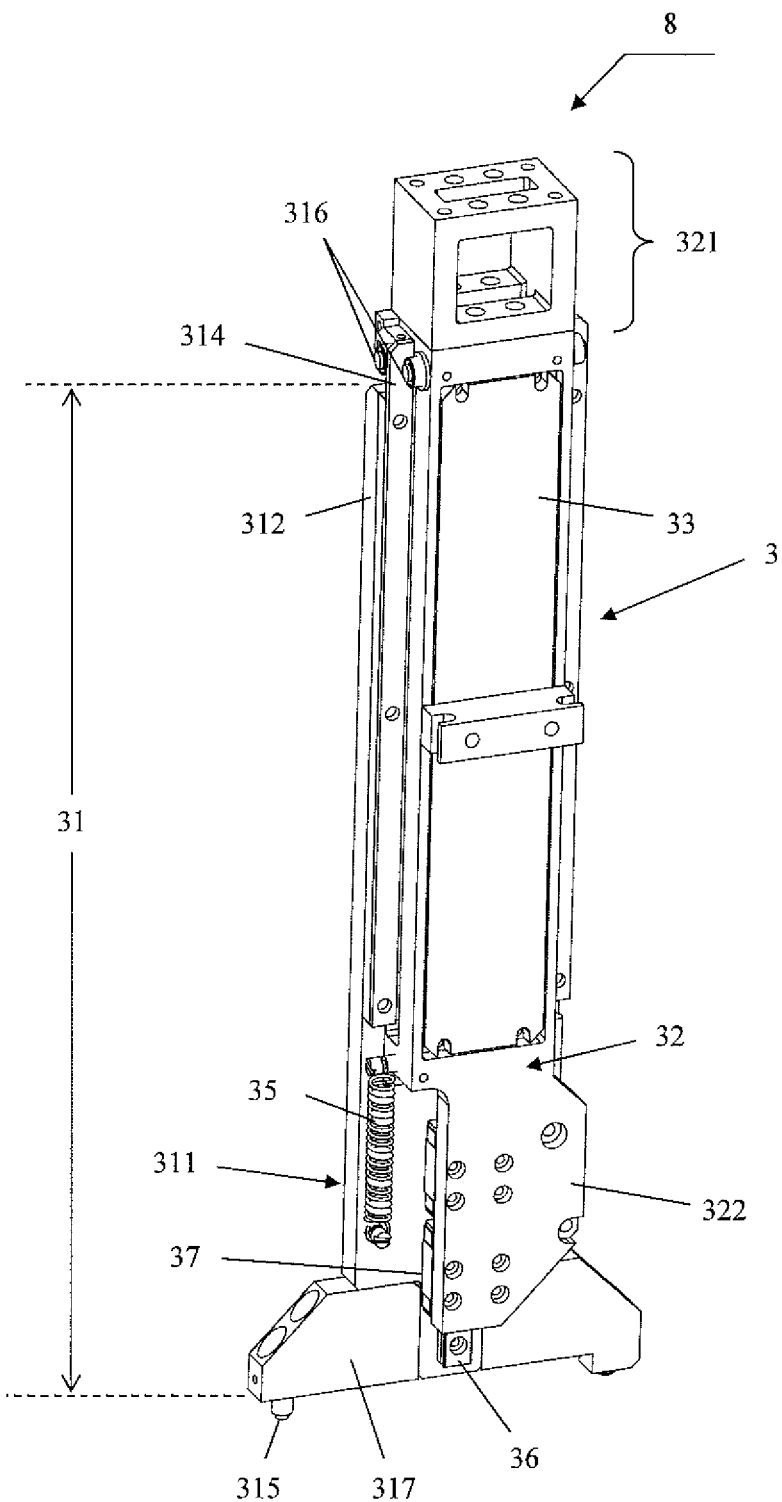
FIG. 2 is a perspective front view of the voice coil assembly.
Figure 3:
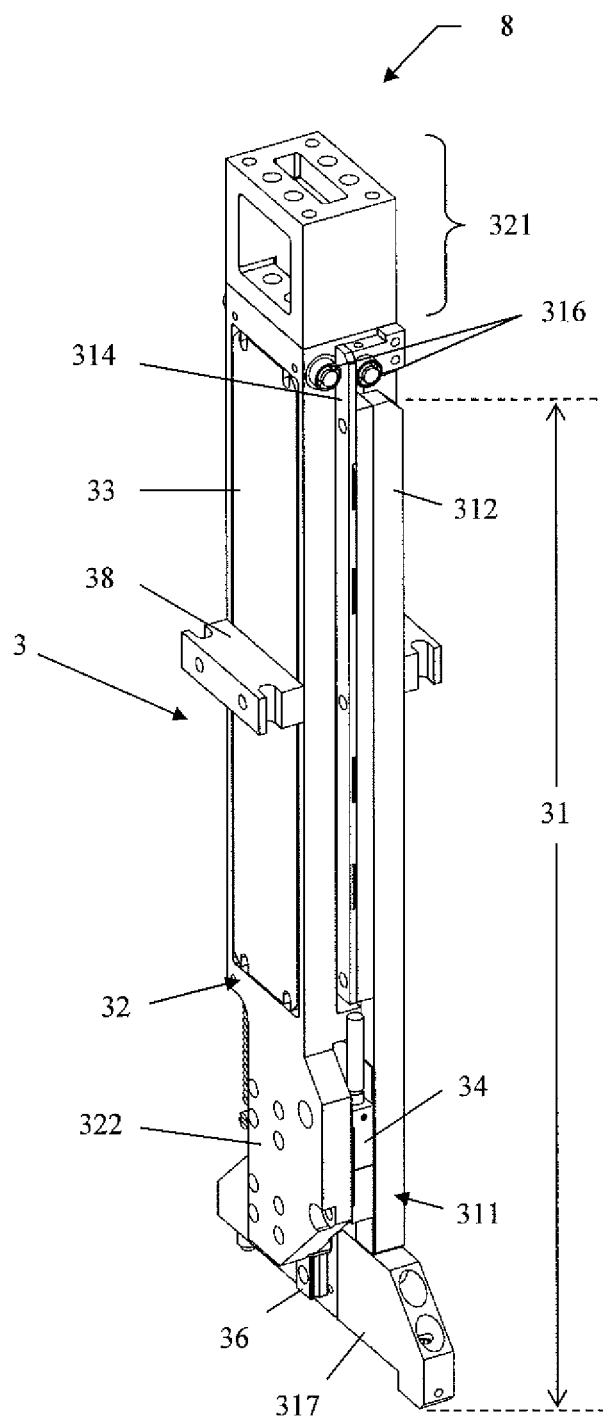
FIG. 3 is another perspective view of the voice coil assembly.
Figure 4:
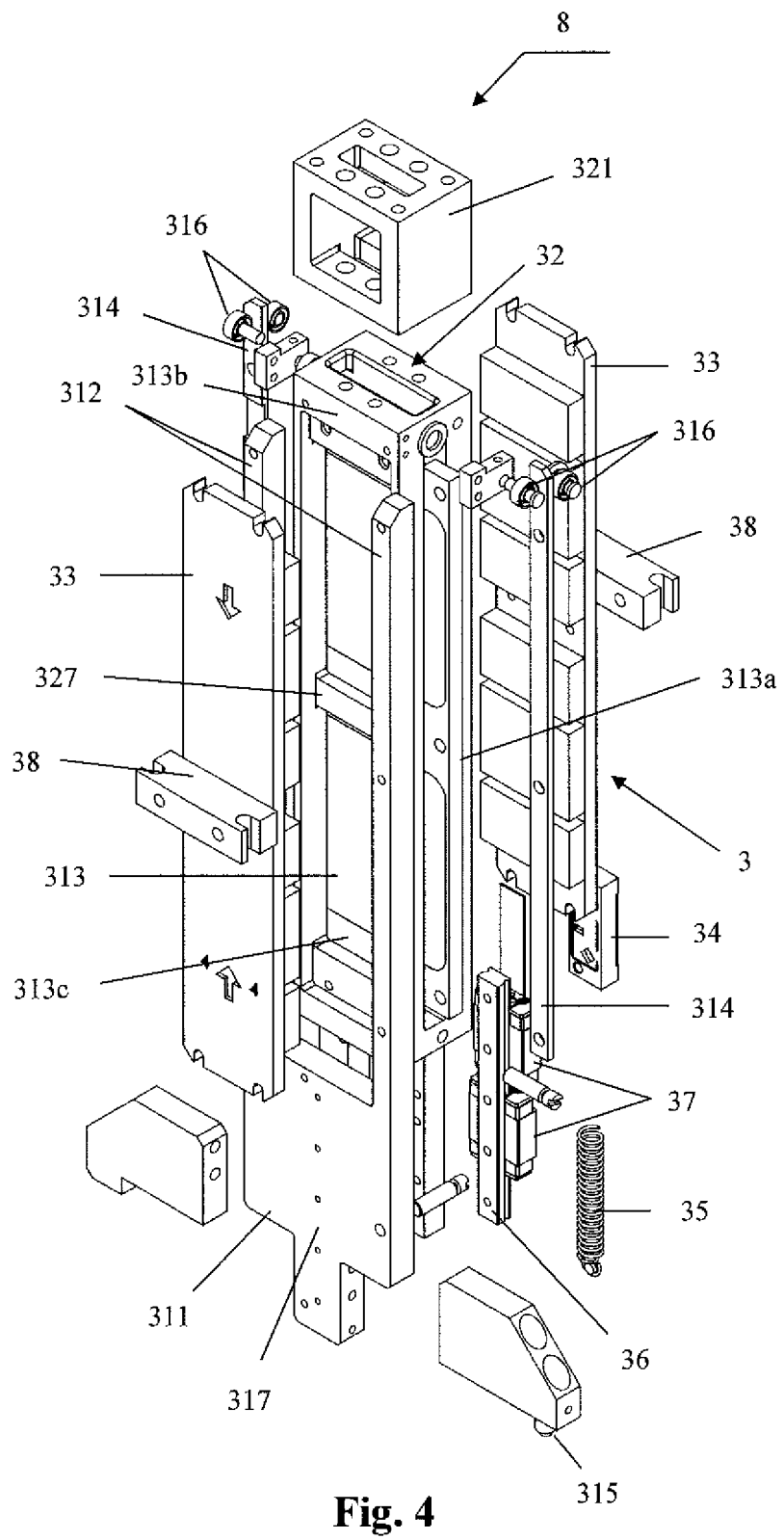
FIG. 4 is the exploded view of the voice coil assembly.
Figure 5:
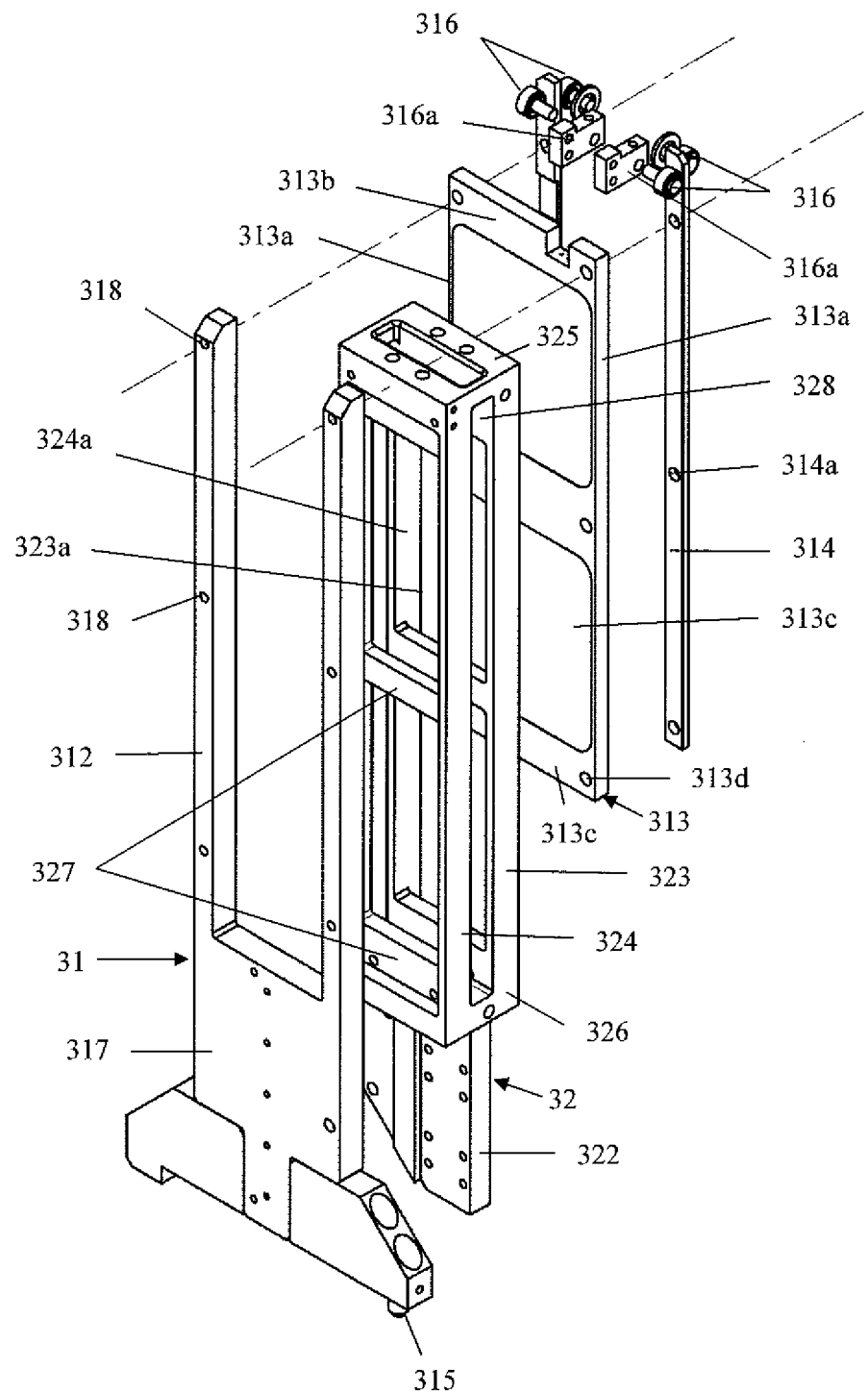
FIG. 5 is the exploded view of the voice coil assembly with certain parts omitted from the drawing.

The voice coil frame (313) of said actuator assembly (31) is designed such that it is shorter in length than said skeletal frame (32) with said top member (313b) aligned with ends of said arms (312) of actuator frame (311), thus defining the range of sliding movement for said actuator frame (311). The uppermost movement of said actuator frame (311) is reached when said top member (313b) of said voice coil frame (313) reaches said top member (325) of said skeletal frame (32) while the lowermost movement of said actuator frame (311) is reached when said bottom member (313c) of said voice coil frame (313) reaches said bottom member (326) of said skeletal frame (32). In other words, the vertical movement of the voice coil frame (313) is limited to a range constrained by the top and bottom sides of said skeletal frame (32). Furthermore, an end of each said slider (314) plates is aligned with the bottom of said bottom member (313c) of said voice coil frame (313) and another end extending beyond said top member (313b) of said voice coil frame (313) and with the sliding movement of said slider (314) plates, and hence said actuator assembly (31), guided by a first guiding means comprising a pair bearing guides (316) fastened to each side of said top member (325) of said skeletal frame (32). If required, spacer bar (316a FIG. 5) can be added between a bearing guide (316) and the top member (313b) of said voice coil frame (313) to adjust alignment of the pair of bearing guides (316). As can be seen in FIG. 2 and FIG. 3, the movement of the actuator assembly (31) is guided by each pair of bearing guides (316) on either side of the top member (325).

The controller means controls the vertical movement of said voice coil actuator assemblies (311) which in turn controls the vertical movement of said pick up heads (7). Said controller means is any of a server, a computer, a microprocessor based controller, a programmable logic controller or the like. Said controller means stores parameters for controlling the direction and magnitude of current to said voice coil of every actuator assembly (31), hence said actuator assemblies (31) are able to function independently of each other in terms of speed and force magnitude. Said controller comprises a user interface and a linear encoder. Said linear encoder is pre-calibrated with said voice coil assemblies (3) to obtain a linear relationship between said current flowing into said voice coil and said actuation force. Said user interface allows user to key in desired parameters such as the magnitude of force required to be applied and the frequency of the actuation. This configuration significantly reduces the set up time since the linear encoder exhibits a linear relationship between the pressing force and said current flow. Calibration is needed again only when there is any part changing such as replacement of faulty parts or a new voice coil assembly (3). Else, users only need to key in the desired value through said user interface to get desired pressing force or operation frequency.

Preferably, the voice coil assembly (3) is further provided with a positioning encoder (34) on the inner surface of said extension plate (322) of said front plate (323) and a high resolution scale tape at a mirror location on the inner surface of the body (317) of the actuator frame (311). The position encoder reads on the high resolution scale tape to determine the position of the actuator frame (311) and is in communication with the controller means to provide continuous feedback on the position of the actuator assembly (31). In the event of errors occurring, such as when the displacement exceeded the predetermined value, which might damage the pick up head (7) or the test station, said controller will halt the apparatus immediately.

Adaptably, said presser (8) may further include an adapter bracket means (321), which is adapted to fixedly mount the top member (325) of said skeletal frame (32) to said first stationary horizontal frame (1). Said adapter bracket means (321) is used to adjust the effective total length of said presser (8). By doing this, the apparatus (10) is able to have presser (8) of fixed length but yet able to cater to various design testing configurations which require different length of reaches of the presser (8).

Referring again to FIG. 1 and FIG. 1a, preferably, the apparatus (10) can be further provided with a second stationary horizontal frame (2) located between said first stationary horizontal frame (1) and said turret (6) and wherein each of said plurality of pressers (8) is further securely and detachably mounted on the second horizontal stationary frame (2) using at least one mounting bracket (38) so as to restrain any sideway movement of the presser (8). In FIG. 1 and FIG. 1a, part of the second stationary horizontal frame (2) is shown removed so as to better illustrate the pressers (8). It is understood to someone skilled in the art that the second stationary horizontal frame (2) should have appropriately positioned and sized slots adapted to allow the vertical support frame to pass through. The second stationary horizontal frame (2) can be further fixedly secured onto the vertical support frame or on the housing (5) of the motor, as required and as appropriate.

Preferably, for safety purpose, the voice coil assembly (3) can be further provided with an urging device (35) to urge each actuator assembly (31) that is in an actuated downward position back to its original idle position in the event of power outage. In the event of power outage, there will be no current flowing into said voice coils, resulting in the actuated actuator assembly (31) remaining in a downward position due to its weight. Without an urging device (35) to urge the actuator assembly (31) back to its idle position, the actuator assembly (31) could collide with test stations or any obstacles when the turret (6) rotates. The urging device (35) can be any resilient means or an electrical device which release stored energy to urge said downwardly actuated actuator assembly (31) to its original idle position in the event of power outage. Also, the device could include a backup battery which delivers current to the voice coil temporarily to return the voice coil actuator to its original position whenever power outage occur. The preferred urging device (35) used in this invention is a spring.

Preferably, the voice coil assembly (3) is provided with a second guiding means to guide the movement of the actuator assembly (31). This second guiding means comprises a linear rail (36) mounted on inner surface of the body (317) of the actuator frame (311) and at least one linear guide (37) mounted on the inner surface of the extension plate (322) of the front plate (323). The linear guide (37) works cooperatively with the linear rail (36) to guide vertical movement of the actuator frame (311).

The apparatus (10) may be secured in a stationary position by mounting on a holding means which maybe either mounted at the bottom, the top or at the sides of said apparatus (10) provided there is sufficient room to locate test stations below said pick up heads (7).

The operation of the apparatus (10) will now be briefly explained. For ease of illustration, the apparatus for use in picking a semiconductor component and placing the semiconductor on a test station and pressing the semiconductor component on the printed circuit board at a test station is used as an example. However, it should be noted that the apparatus for picking and placing or for picking and transferring or for picking, placing and pressing semiconductor components could be deployed in other processes in a wafer production line or a semiconductor components production line. The apparatus (10) first will pick up a semiconductor test component from a first station with one of the pick up head (7). This first station is a gimbal that receives semiconductor components from a feeder. A vision inspection system will check if the orientation of an incoming semiconductor component is correct, otherwise the gimbal orientates the received semiconductor component to the right orientation before said semiconductor component is being picked up by a pick up head (7) of the apparatus (10). The pick up heads (7) are pneumatically controlled to pick up or release the semiconductor components. The turret (6) which holds all pick up heads (7) will then rotate again, and will reach a second station which may be a test station. At a test station, said voice coil in the voice coil actuator assembly (31) will be electrical excited, as determined by signal from the controller means. Thus an electromagnetic force will be generated against said urging device (35). As a result the actuator assembly (31) will slide in axial direction. The direction and the magnitude of displacement said actuator assembly (31) is determined by the direction and magnitude of current flowing into said voice coil. The pusher (315) of a displaced actuator assembly (31) presses on a pick up head (7) located below which in turn presses the test component carried on the pick up head (7) on a printed circuit board or means for testing at the test station. A semiconductor component may be subject to different parametric or functional tests at several different stations to complete all the predetermined tests. Thus each pick up head (7) with the test component that it has picked up will need to move progressively from one station to another. The number of tests depends on users, provided there is enough space to accommodate the test stations.

After a series of tests, all the semiconductor test components that passed all the tests are sent to a station which runs a final round of visual inspection. This visual inspection station checks the bottom and 4 sides of the test components. The good components will be sent to a station for packaging. The components that fail at least one test are sent to the reject station. These stations, including the gimbal, the test stations, the packaging station, the feeder and the vision inspection system or associated auxiliary equipment are outside the scope of this invention and are not described in detail here.

The number of pick up heads can be varied. In one embodiment, 32 pick up heads rotating in a circular motion are provided but the number is not so restricted. The apparatus (10) can be designed such that two test components are picked up during one rotation by diametrically opposite pick up heads. In such configuration, two sets of test stations and feeders are set up. In other words, the maximum distance traveled by each test component is half cycle and the throughput is doubled. Furthermore, using same methodology, this apparatus (10) could be used to test two different semiconductor components at the same time, one type at each half-cycle.

In the illustration above, semiconductor components tested as non defective are sent to a station for packaging. In other processes, the apparatus (10) could be placing the semiconductor components, including wafers, into the input delivery device of another process station or onto a transferring means for transferring the semiconductor components to another process station. These input delivery device or transferring means maybe a bowl, tube, tray, or rail feeder or wafer loader or other input station.

Thus, since the invention disclosed herein may be embodied in other specific embodiments without departing from the scope or general characteristics thereof, the embodiments described herein are to be considered in all respects illustrative and not restrictive. The scope of the invention is to be indicated by the appended claims and all changes which come within the meaning and range of equivalence of the claims are intended to be embraced therein.

The invention claimed is:

1. An apparatus for picking and placing or for picking and transferring or for picking, placing and pressing semiconductor components (10) comprising:
   a motor in a housing (5) and a rotor shaft extending there out, said rotor shaft oriented vertically downward;
   a turret (6) with a plurality of spaced apart pick up heads (7) mounted thereon, said turret (6) mounted on said rotor shaft with its vertical axis coaxial with vertical axis of said rotor shaft and rotatable horizontally about the axis of said rotor shaft;
   a first stationary horizontal frame (1) located vertically above said turret (6);
   a plurality of spaced apart pressers (8) securely and detachably mounted onto said first stationary horizontal frame (1); and
   a controller means electrically connected to each of said pressers (8) to control the direction and magnitude of displacement of said pressers (8),
   wherein each of said pressers (8) is a voice coil assembly (3) comprising a pair of voice coil magnet plates (33) mounted on a skeletal frame (32) with an actuator assembly (31) slidably movable between said pair of voice coil magnet plates (33) in a direction parallel to the axis of said rotor shaft to provide pressing force onto said pick up head (7) located below said actuator assembly (31) at that moment in time and the direction and magnitude of displacement of said actuator assembly (31) is controlled by said controller means.

2. The apparatus for picking and placing or for picking and transferring or for picking, placing and pressing semiconductor components (10) as in claim 1, wherein said skeletal frame (32) includes:
   a front plate (323) with an oblong opening (323a);
   a spaced apart rear plate (324) with an oblong opening (324a), with said front plate (323) and said rear plate (324) joined at the top by a top member (325) and at the bottom by a bottom member (326) to define an oblong opening (328) on each side of the skeletal frame (32) and with said pair of voice coil magnet plates (33), one each securely mounted onto said front plate (323) and said rear plate (324) of said skeletal frame (32) to close up said respective oblong openings (323a, 324a);
   an extension plate (322) at the bottom of said front plate (323); and
   wherein said skeletal frame (32) is detachably secured onto said first stationary horizontal frame (1) through the top member (325).

3. The apparatus for picking and placing or for picking and transferring or for picking, placing and pressing semiconductor components (10) as in claim 2, wherein said presser (8) further includes an adapter bracket means (321) mounted between said first stationary horizontal frame (1) and said top member (325) of said presser (8), to adjust the effective length of said presser (8) to enable said apparatus (10) to operate in various design testing configurations.

4. The apparatus for picking and placing or for picking and transferring or for picking, placing and pressing semiconductor components (10) as in claim 1, wherein said skeletal frame (32) is a non-magnetic metal skeletal frame (32).

5. The apparatus for picking and placing or for picking and transferring or for picking, placing and pressing semiconductor components (10) as in claim 1, wherein each of said actuator assemblies (31) comprises:
   an actuator frame with a body (317) and two arms (312), said arms (312) defining an U-shaped opening which envelops the bottom and sides of said rear plate (324) of said skeletal frame (32) when said actuator frame (311) is in its original position;
   a voice coil frame (313) having two side members (313a) joined together by a top member (313b) and a bottom member (313c) to define an oblong opening (313e), said oblong opening (313e) sufficiently sized to house at least one voice coil, said voice coil frame (313) sandwiched in between said pair of voice coil magnet plates (33) and positioned inside the hollow center of said skeletal frame (32);
   a pair of slider (314) plates fastening the respective side members (313a) of said voice coil frame (313) to the respective arms (312) of said actuator frame (311); and
   a pusher (315) attached at the bottom of said body (317) of said actuator frame (311).

6. The apparatus for picking and placing or for picking and transferring or for picking, placing and pressing semiconductor components (10) as in claim 5, wherein said controller controls the direction and magnitude of current flowing into said voice coil and thus controls the direction and magnitude of displacement of said actuator frame (311).

7. The apparatus for picking and placing or for picking and transferring or for picking, placing and pressing semiconductor components (10) as in claim 5, wherein said voice coil frame (313) is shorter in length than said skeletal frame (32) with said top member (313b) aligned with ends of said arms (312) of actuator frame (311), thus defining the range of sliding movement for said actuator frame (311).

8. The apparatus for picking and placing or for picking and transferring or for picking, placing and pressing semiconductor components (10) as in claim 7, wherein the uppermost movement of said actuator frame (311) is reached when said top member (313b) of said voice coil frame (313) reaches said top member (325) of said skeletal frame (32).

9. The apparatus for picking and placing or for picking and transferring or for picking, placing and pressing semiconductor components (10) as in claim 7, wherein the lowermost movement of said actuator frame (311) is reached when said bottom member (313c) of said voice coil frame (313) reaches said bottom member (326) of said skeletal frame (32).

10. The apparatus for picking and placing or for picking and transferring or for picking, placing and pressing semiconductor components (10) as in claim 5, wherein an end of each said slider (314) plates is aligned with the bottom of said bottom member (313c) of said voice coil frame (313) and another end extending beyond said top member (313b) of said voice coil frame (313) and with the sliding movement of said slider (314) plates guided by a pair bearing guides (316) fastened to each side of said top member (325) of said skeletal frame (32).

11. The apparatus for picking and placing or for picking and transferring or for picking, placing and pressing semiconductor components (10) as in claim 5, wherein each of said voice coil assemblies (3) is further provided with an urging device (35) to return said actuator assembly (31) to its original position after each actuation.

12. The apparatus for picking and placing or for picking and transferring or for picking, placing and pressing semiconductor components (10) as in claim 11, wherein said urging device (35) is a spring.

13. The apparatus for picking and placing or for picking and transferring or for picking, placing and pressing semiconductor components (10) as in claim 11, wherein said urging device (35) is an electrical device which release stored energy to urge said actuator assembly (31) to its original position in the event of power outage.

14. The apparatus for picking and placing or for picking and transferring or for picking, placing and pressing semiconductor components (10) as in claim 11, wherein said voice coil assemblies (3) is further provided with a second guiding means to guide movement of said actuator assemblies (31) comprising a linear rail (36) mounted on inner surface of said body (317) of said actuator frame (311) and at least one linear guide (37) mounted on the inner surface of said extension plate (322) of said front plate (323); said linear guide (37) works cooperatively with said linear rail (36) to guide vertical movement of said actuator frame (311).

15. The apparatus for picking and placing or for picking and transferring or for picking, placing and pressing semiconductor components (10) as in claim 5, wherein the inner surface of said extension plate (322) of said front plate (323) is provided with a positioning encoder (34) and the inner surface of said body (317) of said actuator frame (311) is provided with a high resolution scale tape; said position encoder reads on said high resolution scale tape to determine position of said actuator frame (311) and said controller means in communication with said positioning encoder (34) to receive feedback on position of said actuator assembly (31).

16. The apparatus for picking and placing or for picking and transferring or for picking, placing and pressing semiconductor components (10) as in claim 15, wherein when said controller receives an error of displacement exceeding the predetermined safety level, said controller sends an instruction to said apparatus to halt the whole operation immediately.

17. The apparatus for picking and placing or for picking and transferring or for picking, placing and pressing semiconductor components (10) as in claim 5, wherein said controller means controls each and every actuator assembly (31) independent of each other and wherein said controller means stores predetermined parameters for controlling the direction and magnitude of current to said voice coil in each and every actuator assemblies (31).

18. The apparatus for picking and placing or for picking and transferring or for picking, placing and pressing semiconductor components (10) as in claim 17, wherein said controller means is any of a server, a stand-alone computer, a microprocessor based controller, a programmable logic controller or the like.

19. The apparatus for picking and placing or for picking and transferring or for picking, placing and pressing semiconductor components (10) as in claim 17, wherein said controller comprises an user interface to key in the user parameters; said user's instructions are sent to a linear encoder to carry out the testing operations; said linear encoder is pre-calibrated with said actuator assemblies (31) to obtain a linear relation between said current flowing into said voice coil and said actuation force".

20. The apparatus for picking and placing or for picking and transferring or for picking, placing and pressing semiconductor components (10) as in claim 1, wherein said first stationary horizontal frame (1) is a disc like plate with spaced apart holes (11) for receiving fastening means to detachably fasten said plurality of pressers (8) onto said first stationary horizontal frame (1).

21. The apparatus for picking and placing or for picking and transferring or for picking, placing and pressing semiconductor components (10) as in claim 1, wherein said apparatus is further provided with a second stationary horizontal frame (2) fixedly mounted on said vertical support frame and located between said first stationary horizontal frame (1) and said turret (6) and wherein each of said plurality of pressers (8) is further securely and detachably mounted thereto.

22. The apparatus for picking and placing or for picking and transferring or for picking, placing and pressing semiconductor components (10) as in claim 1, wherein said pick up heads (7) are pneumatically controlled to pick up or release a semiconductor component.

\* \* \* \* \*